(12) United States Patent
Li et al.

(10) Patent No.: US 9,957,630 B2
(45) Date of Patent: May 1, 2018

(54) PATTERN TRANSFER MOLD AND PATTERN FORMATION METHOD

(71) Applicant: KABUSHIKI KAISHA TOSHIBA, Tokyo (JP)

(72) Inventors: Yongfang Li, Kawasaki (JP); Ryoichi Inanami, Yokohama (JP); Akiko Mimotogi, Yokohama (JP); Takashi Sato, Fujisawa (JP); Masato Saito, Machida (JP); Koichi Kokubun, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 937 days.

(21) Appl. No.: 14/334,986

(22) Filed: Jul. 18, 2014

(65) Prior Publication Data

US 2015/0021191 A1 Jan. 22, 2015

(30) Foreign Application Priority Data

Jul. 19, 2013 (JP) .................................. 2013-150947

(51) Int. Cl.
*C25D 5/02* (2006.01)
*C25D 11/32* (2006.01)
(Continued)

(52) U.S. Cl.
CPC .............. *C25D 5/02* (2013.01); *C25D 11/005* (2013.01); *C25D 11/022* (2013.01); *C25D 11/32* (2013.01); *G03F 7/0002* (2013.01)

(58) Field of Classification Search
CPC .............................. C25D 11/022; C25D 11/32
See application file for complete search history.

(56) References Cited

U.S. PATENT DOCUMENTS

2003/0141276 A1 7/2003 Lee
2007/0034599 A1 2/2007 Chen
(Continued)

FOREIGN PATENT DOCUMENTS

CN 101326636 12/2008
JP 2004-6643 1/2004
(Continued)

OTHER PUBLICATIONS

Notification of Comments issued by the Korean Patent Office dated Jan. 14, 2016, for Korean Patent Application No. 10-2014-0089950, and English-language translation thereof.
(Continued)

*Primary Examiner* — James Sanders
(74) *Attorney, Agent, or Firm* — Finnegan, Henderson, Farabow, Garrett & Dunner, L.L.P.

(57) ABSTRACT

According to one embodiment, a pattern transfer mold includes a base body, first and second stacked bodies, first and second electrodes. The base body includes a base unit including a first surface, a first protrusion provided on the first surface and having a first side surface, and a second protrusion provided on the first surface, separated from the first protrusion, and having a second side surface opposing the first side surface. The first stacked body is provided on the first side surface, and includes first conductive layers and a first insulating layer. The second stacked body is provided on the second side surface, separated from the first stacked body, and includes second conductive layers and a second insulating layer. The first electrode is electrically connected to at least one of the first conductive layers. The second electrode is electrically connected to at least one of the second conductive layers.

20 Claims, 9 Drawing Sheets

(51) Int. Cl.
   *C25D 11/02* (2006.01)
   *C25D 11/00* (2006.01)
   *G03F 7/00* (2006.01)

(56) References Cited

U.S. PATENT DOCUMENTS

| | | |
|---|---|---|
| 2008/0347794 | 10/2008 | Shoji |
| 2008/0283900 A1 | 11/2008 | Nakagawa et al. |
| 2009/0295364 A1 | 12/2009 | Cao et al. |
| 2011/0294290 A1 | 12/2011 | Nakanishi et al. |

FOREIGN PATENT DOCUMENTS

| | | |
|---|---|---|
| JP | 2005-309245 | 11/2005 |
| JP | 2007-525832 | 9/2007 |
| JP | 2008-47797 | 2/2008 |
| JP | 2008-213327 | 9/2008 |
| JP | 2009-505845 | 2/2009 |
| JP | 2009-88369 | 4/2009 |
| JP | 2010-206093 | 9/2010 |
| JP | 2011-146496 | 7/2011 |

OTHER PUBLICATIONS

Yokoo, "Nanoelectrode Lithography," Jpn. J. Appl. Phys., vol. 42, Feb. 1, 2003, pp. L92-L94.
Yokoo et al., "Oxidation Patterning of GaAs by Nanoelectrode Lithography," Jpn. J. Appl. Phys., vol. 44, 2005, pp. 1119-1122.
Yokoo, "Nanoelectrode lithography and multiple patterning," J. Vac. Sci. Technol. B, vol. 21, Nov./Dec. 2003, pp. 2966-2969.
Shim et al., "Hard-tip, soft-spring lithography," Nature, vol. 469, Jan. 27, 2011, pp. 516-520.

PATTERN TRANSFER MOLD AND PATTERN FORMATION METHOD

CROSS-REFERENCE TO RELATED APPLICATIONS

This application is based upon and claims the benefit of priority from Japanese Patent Application No. 2013-150947, filed on Jul. 19, 2013; the entire contents of which are incorporated herein by reference.

FIELD

Embodiments described herein relate generally to a pattern transfer mold and a pattern formation method.

BACKGROUND

It is desirable to downscale, for example, electronic devices and micro electromechanical elements (Micro Electro Mechanical Systems (MEMS)). Methods for forming fine patterns include imprinting technology. For example, a mold capable of transferring a fine pattern is desirable.

DETAILED DESCRIPTION

Figure 1A:
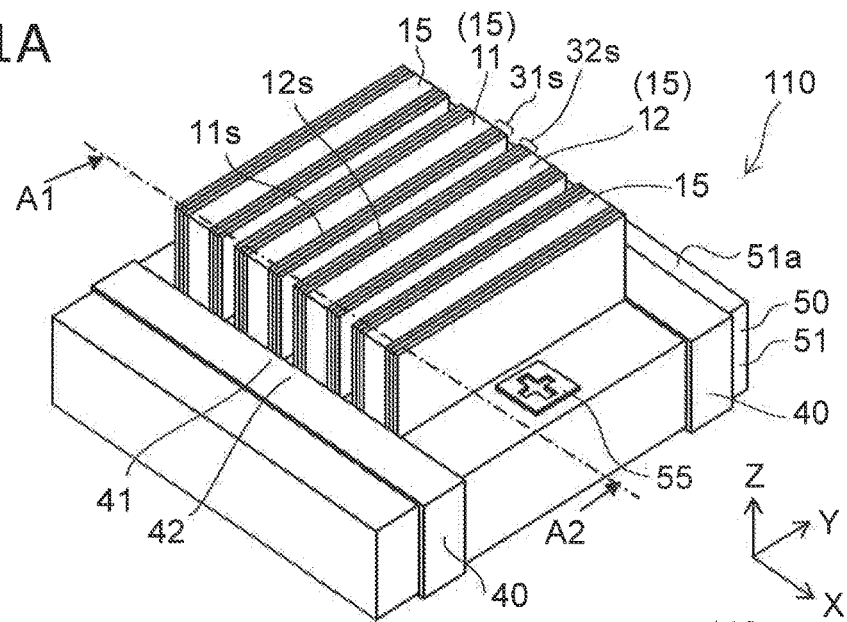
FIG. 1A to FIG. 1C are schematic views illustrating a pattern transfer mold according to a first embodiment.

According to one embodiment, a pattern transfer mold includes a base body, a first stacked body, a second stacked body, a first electrode, and a second electrode. The base body includes a base unit including a first surface, a first protrusion provided on the first surface, the first protrusion having a first side surface intersecting the first surface, and a second protrusion provided on the first surface and separated from the first protrusion in a first direction parallel to the first surface, the second protrusion having a second side surface intersecting the first surface and opposing the first side surface in the first direction. The first stacked body is provided on the first side surface between the first protrusion and the second protrusion. The first stacked body includes a plurality of first conductive layers and a first insulating layer, the first conductive layers being arranged in the first direction, the first insulating layer being provided between the first conductive layers. The second stacked body is provided on the second side surface between the first protrusion and the second protrusion and separated from the first stacked body. The second stacked body includes a plurality of second conductive layers and a second insulating layer, the second conductive layers being arranged in the first direction, the second insulating layer being provided between the second conductive layers. The second stacked body is capable of containing, between the first stacked body and the second stacked body, a gas or a material having a hardness lower than hardnesses of the first protrusion, the second protrusion, the first stacked body, and the second stacked body. The first electrode is electrically connected to at least one of the first conductive layers. The second electrode is electrically connected to at least one of the second conductive layers.

According to one embodiment, a pattern formation method is disclosed. The method can include first supply processing including causing first and second stacked bodies of a pattern transfer mold to oppose a front surface of a patterning body and supplying a voltage between the patterning body and at least one of a plurality of first conductive layers and between the patterning body and at least one of a plurality of second conductive layers. The method can include first removal processing including removing at least a portion of one selected from a first patterning unit of the patterning body and a second patterning unit of the patterning body, the first patterning unit including a first portion of the patterning body and a second portion of the patterning body, the first portion opposing the at least one of the first conductive layers, the second portion opposing the at least one of the second conductive layers, the second patterning unit including a third portion of the patterning body and a fourth portion of the patterning body, the third portion opposing the first insulating layer, the fourth portion opposing the second insulating layer. The pattern transfer mold includes a base body, a first stacked body, a second stacked body, a first electrode, and a second electrode. The base body includes a base unit having a first surface, a first protrusion provided on the first surface, the first protrusion having a first side surface intersecting the first surface, and a second protrusion provided on the first surface and separated from the first protrusion in a first direction parallel to the first surface, the second protrusion having a second side surface intersecting the first surface and opposing the first side surface in the first direction. The first stacked body is provided on the first side surface between the first protrusion and the second protrusion. The first stacked body includes a plurality of first conductive layers and a first insulating layer, the first conductive layers being arranged in the first direction, the first insulating layer being provided between the first conductive layers. The second stacked body is provided on the second side surface between the first protrusion and the second protrusion and separated from the first stacked body. The second stacked body includes a plurality of second conductive layers and a second insulating layer, the second conductive layers being arranged in the first direction, the second insulating layer being provided between the second conductive layers. The second stacked body is capable of containing, between the first stacked body and the second stacked body, a gas or a material having a hardness lower than hardnesses of the first protrusion, the second protrusion, the first stacked body, and the second stacked body. The first electrode is electrically connected to at least one of the first conductive layers. The second electrode is electrically connected to at least one of the second conductive layers.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

Figure 1B:
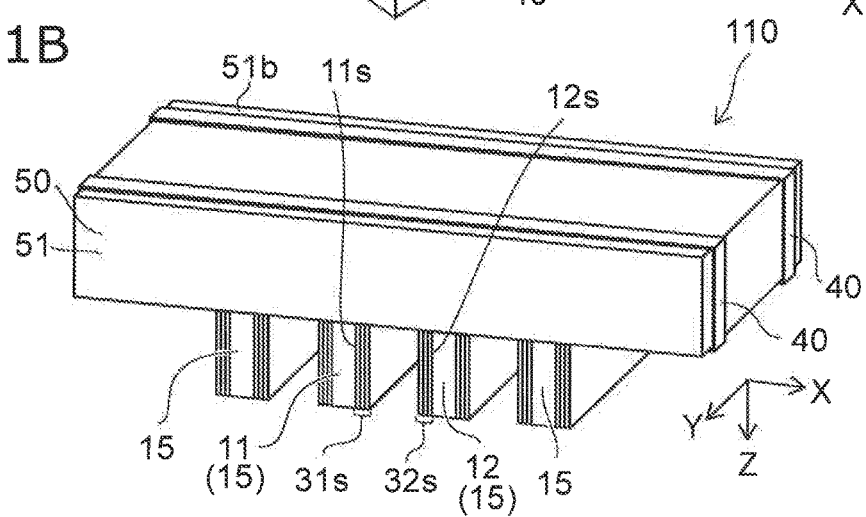
Figure 1C:
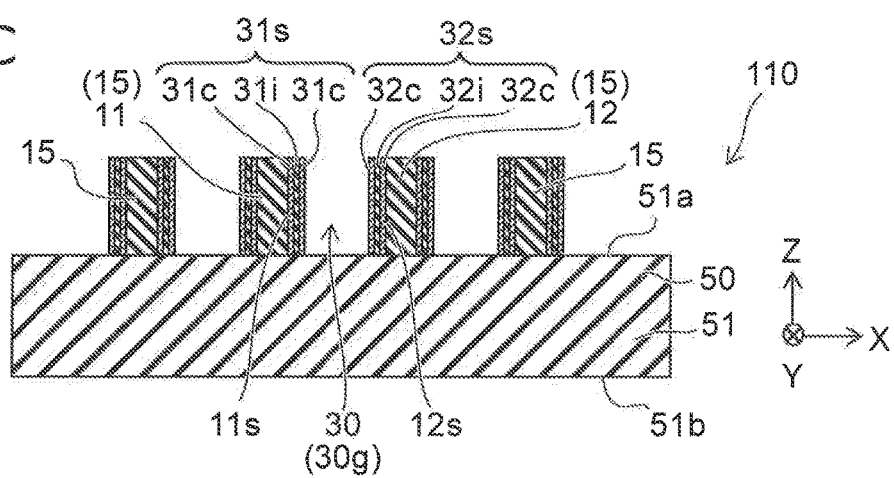

FIG. 1A to FIG. 1C are schematic views illustrating a pattern transfer mold according to a first embodiment.

FIG. 1A and FIG. 1B are schematic perspective views. FIG. 1C is a cross-sectional view along line A1-A2 of FIG. 1A.

As shown in FIG. 1A to FIG. 1C, the pattern transfer mold 110 according to the embodiment includes a base body 50, a first stacked body 31s, a second stacked body 32s, a first electrode 41, and a second electrode 42.

The base body 50 includes a base unit 51 and multiple protrusions 15. The base unit 51 has a first surface 51a and a second surface 51b. The second surface 51b is a surface on the side opposite to the first surface 51a.

A direction perpendicular to the first surface 51a is taken as a Z-axis direction. One direction perpendicular to the Z-axis direction is taken as the X-axis direction. A direction perpendicular to the Z-axis direction and the X-axis direction is taken as the Y-axis direction.

Each of the multiple protrusions 15 is provided at the first surface 51a. The multiple protrusions 15 may include the same material as the base unit 51 or may include a material different from that of the base unit 51. The multiple protrusions 15 may be continuous or discontinuous with the base unit 51. The multiple protrusions 15 include, for example, a first protrusion 11 and a second protrusion 12.

The first protrusion 11 is provided on the first surface 51a. The first protrusion 11 has a first side surface 11s. The first side surface 11s intersects the first surface 51a. In the example, the first side surface 11s is substantially perpendicular to the X-axis direction. In the example, the first side surface 11s extends along the Y-axis direction.

The second protrusion 12 is provided on the first surface 51a. The second protrusion 12 is separated from the first protrusion 11 in a first direction parallel to the first surface 51a. In the example, the first direction is the X-axis direction. The second protrusion 12 has a second side surface 12s. The second side surface 12s intersects the first surface 51a. The second side surface 12s is separated from the first side surface 11s in the first direction (the X-axis direction). The second side surface 12s opposes the first side surface 11s in the first direction (the X-axis direction).

The first stacked body 31s is provided on the first side surface 11s between the first protrusion 11 and the second protrusion 12. The first stacked body 31s includes multiple first conductive layers 31c and a first insulating layer 31i. The multiple first conductive layers 31c are arranged in the first direction (the X-axis direction). The first insulating layer 31i is provided between the multiple first conductive layers 31c.

In the example, the number of the multiple first conductive layers 31c is two. The number of the multiple first conductive layers 31c may be three or more. In the case where the number of the multiple first conductive layers 31c is three or more, multiple first insulating layers 31i are provided. The multiple first insulating layers 31i are disposed at positions between the multiple first conductive layers 31c. In other words, the multiple first conductive layers 31c and the multiple first insulating layers 31i are provided alternately along the first direction.

The second stacked body 32s is provided on the second side surface 12s between the first protrusion 11 and the second protrusion 12. The second stacked body 32s is separated from the first stacked body 31s in the first direction. The second stacked body 32s includes multiple second conductive layers 32c and a second insulating layer 32i. The multiple second conductive layers 32c are arranged in the first direction. The second insulating layer 32i is provided between the multiple second conductive layers 32c.

In the example, the number of the multiple second conductive layers 32c is two. The number of the multiple second conductive layers 32c may be three or more. Multiple second insulating layers 32i are provided in the case where the number of the multiple second conductive layers 32c is three or more. The multiple second insulating layers 32i are disposed at positions between the multiple second conductive layers 32c. In other words, the multiple second conductive layers 32c and the multiple second insulating layers 32i are provided alternately along the first direction.

As recited above, the second stacked body 32s is separated from the first stacked body 31s; and in the example, a region 30 between the first stacked body 31s and the second stacked body 32s is a gap. A gas 30g is containable in the gap. As described below, a material having a low hardness may be inserted between the first stacked body 31s and the second stacked body 32s. The hardness of the material is lower than the hardnesses of the first protrusion 11, the second protrusion 12, the first stacked body 31s, and the second stacked body 32s. The material is, for example, a resin.

Thus, the gas 30g or a material having a low hardness is containable between the first stacked body 31s and the second stacked body 32s. In other words, the second stacked body 32s is capable of containing, between the first stacked body 31s and the second stacked body 32s, the gas 30g or a material having a hardness lower than the hardnesses of the first protrusion 11, the second protrusion 12, the first stacked body 31s, and the second stacked body 32s.

The first electrode 41 is electrically connected to at least one of the multiple first conductive layers 31c. In the example, the first electrode 41 is electrically connected to each of the multiple first conductive layers 31c.

A voltage can be applied (supplied) to at least one of the multiple first conductive layers 31c via the first electrode 41. A current can be supplied to at least one of the multiple first conductive layers 31c via the first electrode 41.

The second electrode 42 is electrically connected to at least one of the multiple second conductive layers 32c. In the example, the second electrode 42 is electrically connected to each of the multiple second conductive layers 32c.

A voltage can be applied (supplied) to at least one of the multiple second conductive layers 32c via the second electrode 42. A current can be supplied to at least one of the multiple second conductive layers 32c via the second electrode 42.

In the example, the second electrode 42 is continuous with the first electrode 41. In the embodiment, the first electrode 41 and the second electrode 42 may be separated. In other words, the voltage that is applied (supplied) to the first conductive layers 31c may be implemented independently from or simultaneously with the voltage that is applied (supplied) to the second conductive layers 32c.

In the example as illustrated in FIG. 1A, an alignment mark 55 is provided on the first surface 51a of the base unit 51. The alignment with the patterning body described below can be implemented using the alignment mark 55.

The base unit 51 of the base body 50 may include, for example, glass or a resin such as polydimethylsiloxane (PDMS), paraxylene, etc. The base unit 51 is, for example, insulative. The base unit 51 is, for example, light-transmissive.

The multiple protrusions 15 (the first protrusion 11 and the second protrusion 12) may include, for example, a material such as silicon, quartz, a resin, etc. The multiple protrusions 15 are, for example, insulative.

The heights of the multiple protrusions 15 are, for example, not less than 30 nanometers (nm) and not more than 30 micrometers (μm). The lengths (the widths) in the first direction (the X-axis direction) of the multiple protrusions 15 are, for example, not less than 1 nm and not more than 100 nm. The pitch of the multiple protrusions 15 is, for example, not less than 1 nm and not more than 100 nm. The pitch is, for example, the distance in the first direction between the first-direction center of the first protrusion 11 and the first-direction center of the second protrusion 12. The distance between the first protrusion 11 and the second protrusion 12 is, for example, not less than 3 nm and not more than 30 nm.

In the example, each of the multiple protrusions 15 has a band configuration extending in the Y-axis direction.

The multiple protrusions 15 are designed appropriately to match the pattern that is formed.

The first conductive layers 31c of the first stacked body 31s and the second conductive layers 32c of the second stacked body 32s include, for example, a metal. The first conductive layers 31c and the second conductive layers 32c include a conductive metal or a conductive metal oxide. The first conductive layers 31c and the second conductive layers 32c include, for example, at least one selected from Ru, Pt, Rh, W, Ni, Au, Ir, RuO, and IrO$_x$.

The first insulating layer 31i of the first stacked body 31s and the second insulating layer 32i of the second stacked body 32s are, for example, a metal compound, etc. For example, a metal oxide, a metal nitride, a metal oxynitride, or the like is used.

The thicknesses (the lengths along the first direction) of the multiple first conductive layers 31c are, for example, not less than 1 nm and not more than 100 nm. The thicknesses of the multiple first conductive layers 31c may be different from each other. For example, the spacing between the multiple first conductive layers 31c, i.e., the thickness (the length along the first direction) of the first insulating layer 31i, is not less than 1 nm and not more than 100 nm. The thicknesses of the multiple first insulating layers 31i may be different from each other. The thickness of each of the multiple first conductive layers 31c may be, for example, not less than 1 nm and not more than 30 nm. The thickness of the first insulating layer 31i may be, for example, not less than 1 nm and not more than 30 nm.

The thickness (the length along the first direction) of each of the multiple second conductive layers 32c is, for example, not less than 1 nm and not more than 100 nm. The thicknesses of the multiple second conductive layers 32c may be different from each other. For example, the spacing between the multiple second conductive layers 32c, i.e., the thickness (the length along the first direction) of the second insulating layer 32i, is not less than 1 nm and not more than 100 nm. The thicknesses of the multiple second insulating layers 32i may be different from each other. The thicknesses of the second conductive layers 32c are, for example, the same as the thicknesses of the first conductive layers 31c. The thicknesses of the second conductive layers 32c may be different from the thicknesses of the first conductive layers 31c. The thickness of the second insulating layer 32i is, for example, the same as the thickness of the first insulating layer 31i. The thickness of the second insulating layer 32i may be different from the thickness of the first insulating layer 31i. The thicknesses of the multiple second conductive layers 32c may be, for example, not less than 1 nm and not more than 30 nm. The thickness of the second insulating layer 32i may be, for example, not less than 1 nm and not more than 30 nm.

For example, the lengths in the first direction of each of the multiple first conductive layers 31c are not more than the length in the first direction of the first protrusion 11. The length in the first direction of the first insulating layer 31i is not more than the length in the first direction of the first protrusion 11.

As described below, the pattern of the first conductive layers 31c and the second conductive layers 32c is transferred onto a patterning body. A fine pattern can be transferred by setting the thicknesses of each of the first conductive layers 31c and the second conductive layers 32c to be thin. For example, a pattern that is smaller than the pattern dimensions on the mold can be transferred.

The first electrode 41 and the second electrode 42 include, for example, a metal such as Al, Cu, W, Au, etc.

The dimensions and materials recited above are examples.

In the pattern transfer mold 110 according to the embodiment, the pitch of the multiple first conductive layers 31c is less than the length (the width) in the first direction (the X-axis direction) of the first protrusion 11. The pitch of the multiple second conductive layers 32c is less than the length (the width) in the first direction (the X-axis direction) of the second protrusion 12. In other words, the first conductive layers 31c and the second conductive layers 32c have a pitch that is smaller than the pitch of the protrusions 15.

The first conductive layers 31c and the second conductive layers 32c have a pattern of, for example, not less than 1 nm and not more than 10 nm.

An example of a pattern formation method using the pattern transfer mold 110 will now be described.

Figure 2:
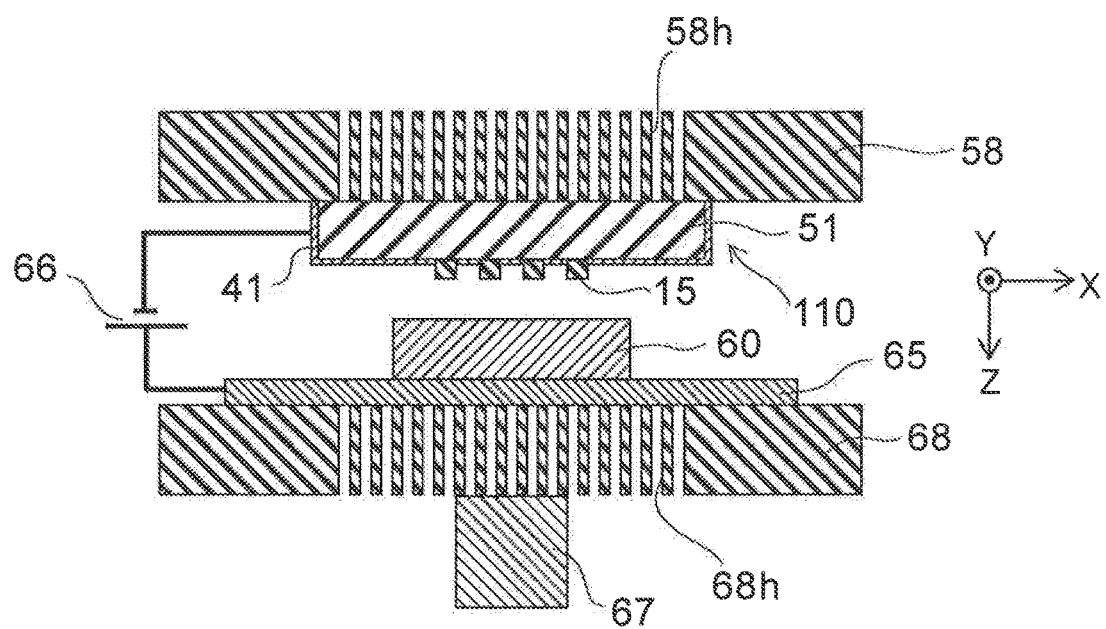
FIG. 2 is a schematic view illustrating the pattern formation method using the pattern transfer mold according to the first embodiment.

FIG. 2 is a schematic view illustrating the pattern formation method using the pattern transfer mold according to the first embodiment.

As shown in FIG. 2, the pattern transfer mold 110 is held by a mold holder 58. For example, holes 58h for depressurizing are provided in the mold holder 58. The pattern transfer mold 110 is held by the mold holder 58 by depressurizing via the holes 58h. In the drawing, the first electrode 41 is shown, but the second electrode 42 is not shown.

On the other hand, a substrate holder 68 is disposed on a stage 67. A conductive substrate 65 is disposed on the substrate holder 68. A patterning body 60 is disposed on the conductive substrate 65. The pattern that is provided in the pattern transfer mold 110 is transferred onto the patterning body 60. In other words, patterning is performed.

The patterning body 60 and the pattern transfer mold 110 oppose each other along the Z-axis direction. The distance between the patterning body 60 and the pattern transfer mold 110 is variable. In the embodiment, the patterning body 60 may move; and the pattern transfer mold 110 may move. Both may move. In the example, the stage 67 can move along the Z-axis direction. Thereby, the patterning body 60 moves along the Z-axis direction.

FIG. 2 shows the state in which the patterning body 60 is separated from the pattern transfer mold 110. The patterning body 60 contacts or approaches the pattern transfer mold 110 by the stage 67 moving along the Z-axis direction.

For example, a power supply 66 is connected to the electrode (the first electrode 41) and the conductive substrate 65. A potential difference can be formed between the pattern transfer mold 110 and the patterning body 60 disposed on the conductive substrate 65 in the state in which the patterning body 60 contacts or approaches the pattern transfer mold 110.

Figure 3A:
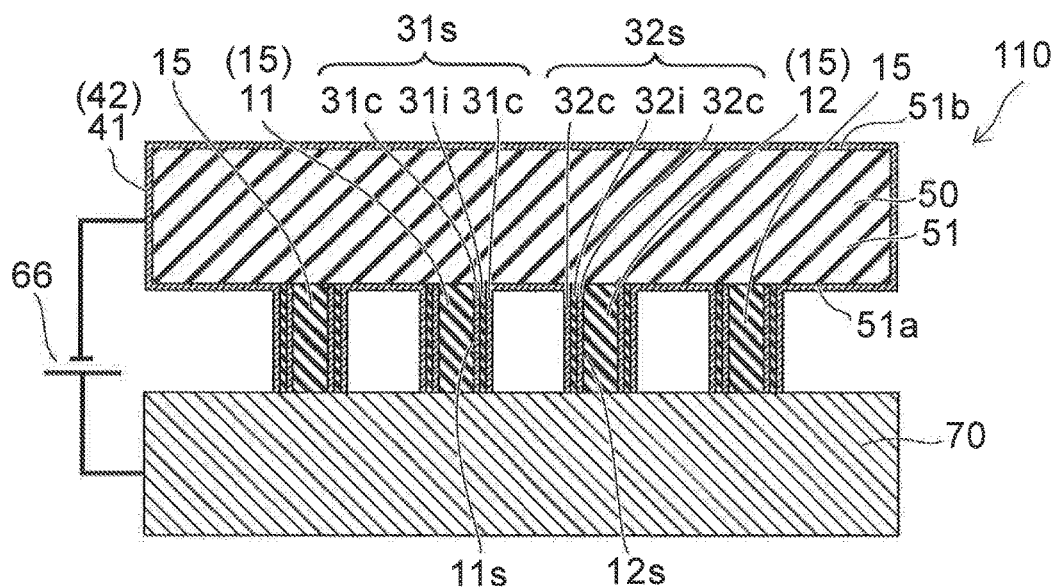
FIG. 3A and FIG. 3B are schematic cross-sectional views illustrating the pattern formation method using the pattern transfer mold according to the first embodiment.
Figure 3B:
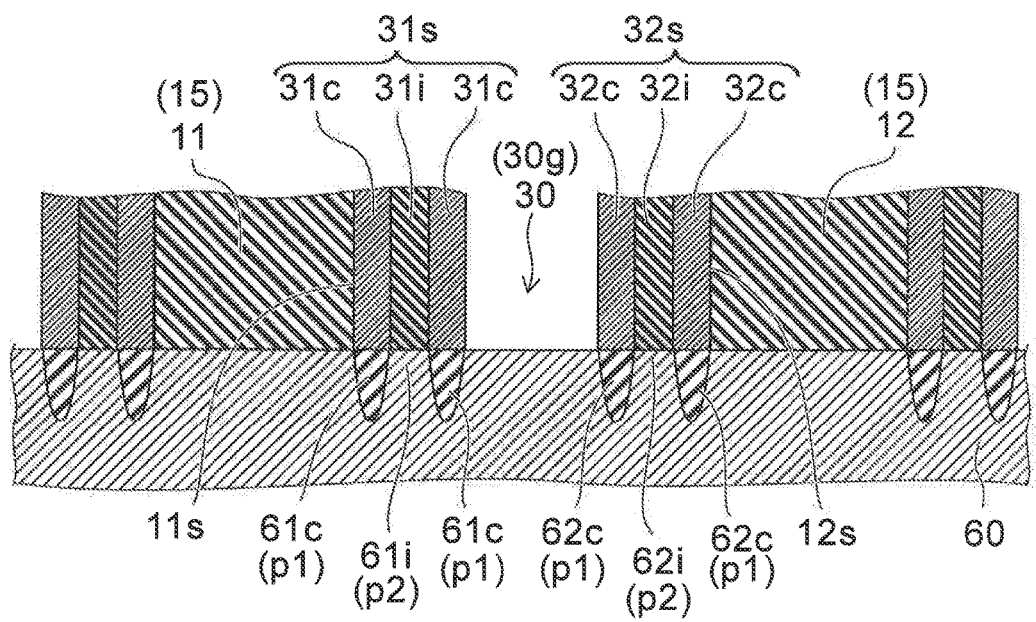

FIG. 3A and FIG. 3B are schematic cross-sectional views illustrating the pattern formation method using the pattern transfer mold according to the first embodiment.

FIG. 3A shows the pattern transfer mold 110 and the patterning body 60. FIG. 3B shows an enlarged portion of FIG. 3A.

As shown in FIG. 3A, the patterning body 60 contacts or approaches the first conductive layers 31c and the second conductive layers 32c. In this state, a potential difference is formed between the patterning body 60 and the pattern transfer mold 110 by the power supply 66.

As shown in FIG. 3B, the patterning body 60 includes a first portion 61c opposing the multiple first conductive layers 31c, a second portion 62c opposing the multiple second conductive layers 32c, a third portion 61i opposing the first insulating layer 31i, and a fourth portion 62i opposing the second insulating layer 32i. The first portion 61c and the second portion 62c are included in a first patterning unit p1. The third portion 61i and the fourth portion 62i are included in a second patterning unit p2.

A potential difference is formed between the patterning body 60 and the first conductive layers 31c and between the patterning body 60 and the second conductive layers 32c by the application (the supply) of the voltage to the electrodes (the first electrode 41 and the second electrode 42). The chemical properties of the first patterning unit p1 and the chemical properties of the second patterning unit p2 can be different from each other due to the potential difference.

For example, the patterning body 60 includes silicon. For example, a silicon substrate is used as the patterning body 60. Silicon oxide is formed by the silicon being oxidized by the potential difference formed between the patterning body 60 and the first conductive layers 31c and between the patterning body 60 and the second conductive layers 32c. In other words, the first patterning unit p1 becomes silicon oxide. On the other hand, the second patterning unit p2 where a potential difference is not formed remains as silicon.

The etching resistance is different between silicon oxide and silicon. In the example, the chemical properties include, for example, the etching resistance.

Thus, the pattern of the multiple first conductive layers 31c and the multiple second conductive layers 32c provided in the pattern transfer mold 110 are transferred onto the patterning body 60.

For example, the first patterning unit p1 is removed by a first etching. At this time, the second patterning unit p2 substantially is not etched. The depth of the etching of the first patterning unit p1 is arbitrary. For example, the depth is determined by the etching selectivity between the first patterning unit p1 and the second patterning unit p2. A portion of the first patterning unit p1 may remain.

Or, for example, a portion (a portion in the Z-axis direction) of the second patterning unit p2 is removed by a second etching. At this time, the first patterning unit p1 substantially is not etched. The etchant (e.g., at least one selected from a gas and a liquid) that is used in the second etching is different from the etchant used in the first etching.

Thus, the pattern of the pattern transfer mold 110 is transferred onto the patterning body 60 by selectively removing one selected from the first patterning unit p1 and the second patterning unit p2. The pattern of the pattern transfer mold 110 includes the pattern of the multiple first conductive layers 31c and the multiple second conductive layers 32c.

As recited above, the pitch of the first conductive layers 31c and the second conductive layers 32c is less than the pitch of the protrusions 15. Therefore, a pattern having a pitch that is smaller than the pitch of the protrusions 15 can be formed in the patterning body 60.

In other words, a pattern of the first conductive layers 31c, the first insulating layer 31i, and the second conductive layers 32c of, for example, not less than 1 nm and not more than 10 nm can be transferred onto the patterning body 60 at a spacing of not less than 1 nm and not more than 10 nm. The transferring can be performed with high throughput.

Due to the aggressive integration and price competition for semiconductors, technology is necessary to realize lithography having low patterning costs and a resolution of about 10 nm or less. Conventional photolithography is approaching the patterning limits due to the constraints of the refractive index of light. Patterning of about 20 nm or less is possible by combining conventional technology. However, it is difficult to realize lithography technology of about 10 nm or less.

On the other hand, nanoimprint lithography is drawing attention because a fine pattern can be transferred collectively at low cost and with high resolution. This method transfers the dimensions of the pattern onto the mold in a 1:1 relationship. In other words, because a mold master form of about 10 nm or less is necessary to transfer a pattern of about 10 nm or less, realization is difficult in the current state of the art.

For example, scanning probe microscope (SPM) lithography uses an electrochemical reaction. It is considered that relatively fine patterning is possible by such a method. However, it is difficult to obtain high throughput in such a method because a probe is scanned. Further, in such a method, the tip of the probe wears as the patterning is performed; the patterning characteristics degrade easily; and the stability is low.

Conversely, in the embodiment, the pattern of the multiple conductive layers can be transferred onto the patterning body 60 collectively without using a probe. The problems of wear substantially do not occur.

However, in the case where the multiple conductive layers are collectively caused to contact or approach the patterning body 60, there may be cases where the contact state between the patterning body 60 and the conductive layers is nonuniform between the multiple conductive layers. For example, there may be cases where the distance between the patterning body 60 and the conductive layers is nonuniform between the multiple conductive layers.

At this time, in the embodiment, gaps are provided between the first stacked body 31s and the second stacked body 32s. In other words, the gas 30g is containable between the first stacked body 31s and the second stacked body 32s. Thereby, the first protrusion 11 and the first stacked body 31s deform easily. The second protrusion 12 and the second stacked body 32s also deform easily.

Therefore, for example, the first protrusion 11 and the first stacked body 31s easily deform conformally with the patterning body 60. Also, the second protrusion 12 and the second stacked body 32s easily deform conformally with the patterning body 60.

Thereby, the contact state between the patterning body 60 and the multiple first conductive layers 31c is uniform between the multiple first conductive layers 31c. The contact state between the patterning body 60 and the multiple second conductive layers 32c is uniform between the multiple second conductive layers 32c. The distance between the patterning body 60 and the multiple first conductive layers 31c is uniform between the multiple first conductive layers 31c. The distance between the patterning body 60 and the multiple second conductive layers 32c is uniform between the multiple second conductive layers 32c. For example, the responsiveness of the conductive layers to the configuration of the front surface of the patterning body 60 is high. For example, even in the case where an unevenness exists in the front surface of the patterning body 60, a good pattern can be transferred.

Thereby, the precision of the pattern formation increases. The stability of the pattern formation increases. The reproducibility of the pattern formation increases. Thereby, a finer pattern is practically implementable. According to the embodiment, a pattern transfer mold and a pattern formation method that can transfer a fine pattern can be provided.

For example, there is a reference example in which a material having a high hardness is filled between the first stacked body 31s and the second stacked body 32s. The material is, for example, a metal oxide. In the reference example, the protrusions and the stacked bodies do not deform easily. Therefore, the contact state between the patterning body 60 and the multiple conductive layers easily becomes nonuniform between the multiple conductive layers. Also, the distance between the patterning body 60 and the multiple conductive layers easily becomes nonuniform between the multiple conductive layers. Therefore, the precision of the pattern formation is low; the stability is low; and the reproducibility is low.

According to the embodiment, a practical lithography method that has the high throughput of conventional nanoimprint technology and the high resolution of SPM lithography technology can be provided.

In the embodiment, the hardnesses of the first stacked body 31s and the second stacked body 32s may be higher than the hardnesses of the first protrusion 11 and the second protrusion 12. Thereby, the contact state between the patterning body 60 and the pattern transfer mold is more uniform.

In the embodiment, the patterning body 60 may include at least one selected from a metal and a semiconductor (including silicon). In such a case, for example, at least a portion of the at least one selected from the metal and the semiconductor recited above included in the first patterning unit p1 (and the second patterning unit p2) may be oxidized.

FIG. 4A to FIG. 4F are schematic cross-sectional views in order of the processes, illustrating a method for manufacturing the pattern transfer mold according to the first embodiment.

Figure 4A:
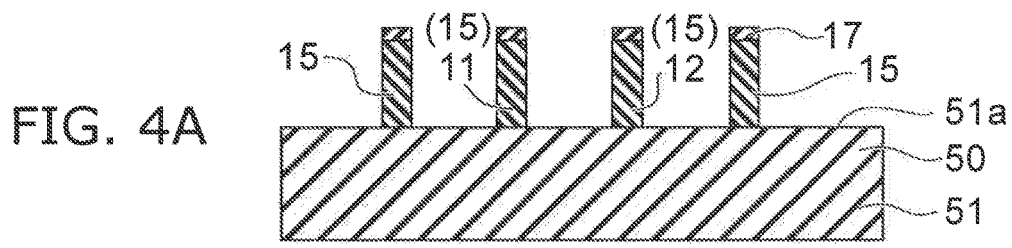
FIG. 4A to FIG. 4F are schematic cross-sectional views in order of the processes, illustrating a method for manufacturing the pattern transfer mold according to the first embodiment.

As shown in FIG. 4A, a first resist layer 17 having a prescribed configuration is formed by lithography on a substrate (e.g., an insulative substrate) used to form the base body 50; and the substrate is patterned by, for example, RIE (Reactive Ion Etching), etc. Thereby, the multiple protrusions 15 (the first protrusion 11 and the second protrusion 12) and the base unit 51 are formed.

Figure 4B:
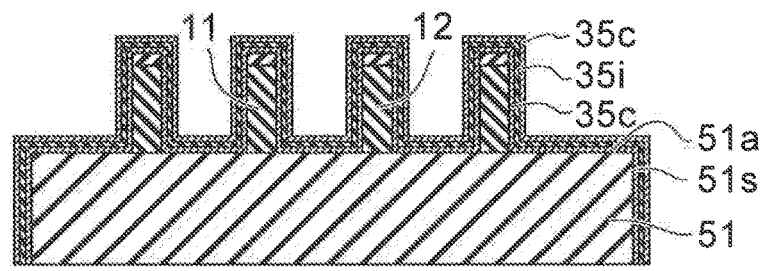

As shown in FIG. 4B, a conductive film 35c and an insulating film 35i that are used to form the stacked bodies (the first stacked body 31s and the second stacked body 32s) are formed alternately. The conductive film 35c includes a metal or a metal oxide. The insulating film 35i includes, for example, a metal compound, etc. The formation of the conductive film 35c and the insulating film 35i is repeated the necessary number of times. In the example, the conductive film 35c and the insulating film 35i are formed also on a side surface unit 51s of the base unit 51. The side surface unit 51s includes a surface intersecting the first surface 51a.

Figure 4C:
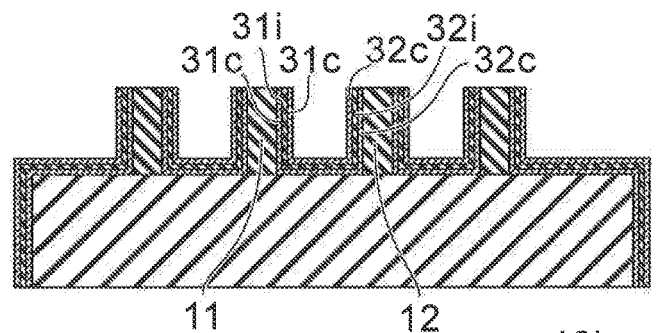

As shown in FIG. 4C, the first resist layer 17 is removed. Lift-off is performed. Thereby, the first stacked body 31s and the second stacked body 32s are formed from the conductive film 35c and the insulating film 35i. In other words, the first conductive layers 31c and the second conductive layers 32c are formed from the conductive film 35c. The first insulating layer 31i and the second insulating layer 32i are formed from the insulating film 35i.

Figure 4D:
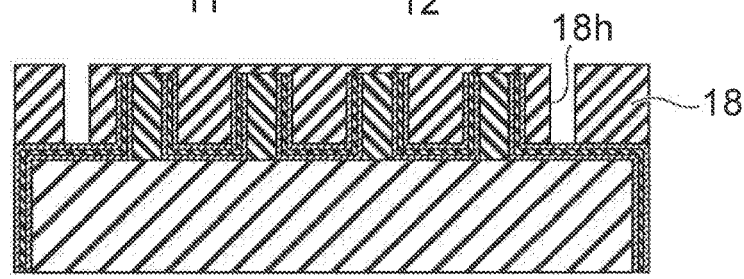

As shown in FIG. 4D, a second resist layer 18 that has an opening 18h is made by lithography; and the conductive film 35c and the insulating film 35i that are exposed at the opening 18h are removed. The removal may include, for example, wet etching.

The multiple protrusions 15 are provided on a portion of the first surface 51a. The region where the multiple protrusions 15 are provided corresponds to the pattern formation region. The first surface 51a includes a central portion and a peripheral portion around the central portion. The pattern formation region is provided, for example, in the central portion. The opening 18h recited above is provided, for example, in the peripheral portion of the first surface 51a. Multiple pattern formation regions may be provided in the first surface 51a. The opening 18h may be provided between the multiple pattern formation regions of the first surface 51a.

Figure 4E:
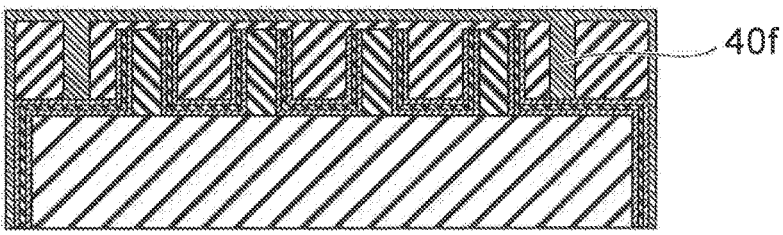

As shown in FIG. 4E, a conductive film 40f is formed on the front surface of the second resist layer 18 and the surface exposed from the opening 18h. The conductive film 40f includes, for example, a metal. The conductive film 40f is used to form, for example, the electrodes (the first electrode 41, the second electrode 42, etc.).

Figure 4F:
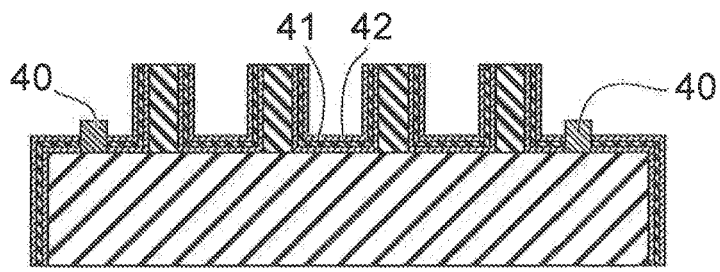

As shown in FIG. 4F, the second resist layer 18 is removed. The conductive film 40f that is formed on the front surface of the second resist layer 18 is removed by lift-off. Thereby, electrodes 40 (the first electrode 41, the second electrode 42, etc.) are formed.

Thereby, the pattern transfer mold 110 according to the embodiment is made.

In the embodiment, as described above, the gap is provided between the first stacked body 31s and the second stacked body 32s. In the example, the gas 30g is containable in the gap. Thereby, the protrusions 15 and the stacked bodies deform easily; and the contact state or distance between the patterning body 60 and the conductive layers is uniform. Thereby, a fine pattern is transferable.

Figure 5A:
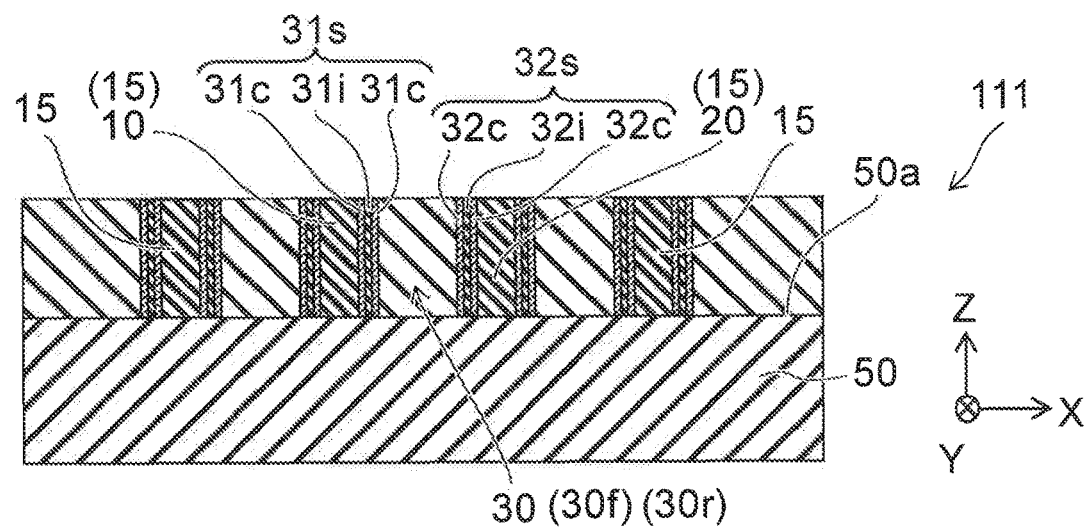
FIG. 5A and FIG. 5B are schematic cross-sectional views illustrating other pattern transfer molds according to the first embodiment.
Figure 5B:
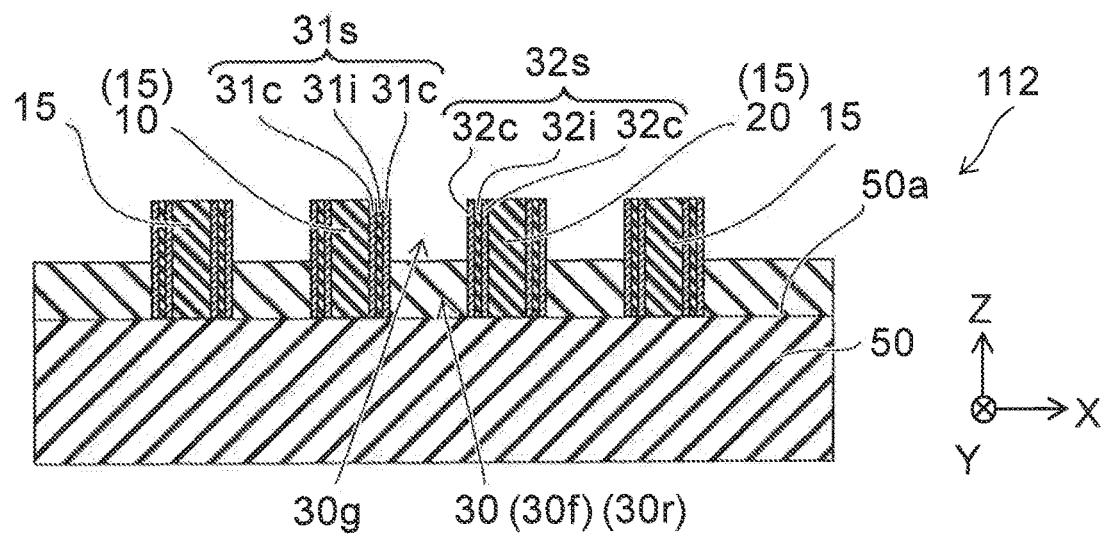

FIG. 5A and FIG. 5B are schematic cross-sectional views illustrating other pattern transfer molds according to the first embodiment.

In the pattern transfer mold 111 according to the embodiment as shown in FIG. 5A, a filled unit 30f is provided in the region 30 between the first stacked body 31s and the second stacked body 32s. The filled unit 30f includes a material having a hardness lower than the hardnesses of the first protrusion 11, the second protrusion 12, the first stacked body 31s, and the second stacked body 32s. The filled unit 30f includes, for example, a resin layer 30r.

The resin layer 30r includes, for example, a polyimide resin, an epoxy resin, a paraxylene resin, a silicon resin, etc. The hardness of the resin layer 30r is lower than the hardnesses of the first protrusion 11, the second protrusion 12, the first stacked body 31s, and the second stacked body 32s.

In the pattern transfer mold 112 according to the embodiment as shown in FIG. 5B, the filled unit 30f (the resin layer 30r) recited above is provided in a portion of the region 30 between the first stacked body 31s and the second stacked body 32s. The other portions of the region 30 are the gap; and the gas 30g is contained in the other portions of the region 30.

For the pattern transfer molds 111 and 112 as well, the protrusions 15 and the stacked bodies deform easily; and the contact state or distance between the patterning body 60 and the conductive layers is uniform. For example, the responsiveness of the conductive layers to the configuration of the front surface of the patterning body 60 is high. Thereby, a fine pattern is transferable.

Thus, in the embodiment, the filled unit 30f of a material having a hardness lower than the hardnesses of the first protrusion 11, the second protrusion 12, the first stacked body 31s, and the second stacked body 32s may be provided in at least a portion of the space (the region 30) between the first stacked body 31s and the second stacked body 32s.

In the embodiment, the resin layer 30r may be provided in at least a portion of the space (the region 30) between the first stacked body 31s and the second stacked body 32s.

Figure 6A:
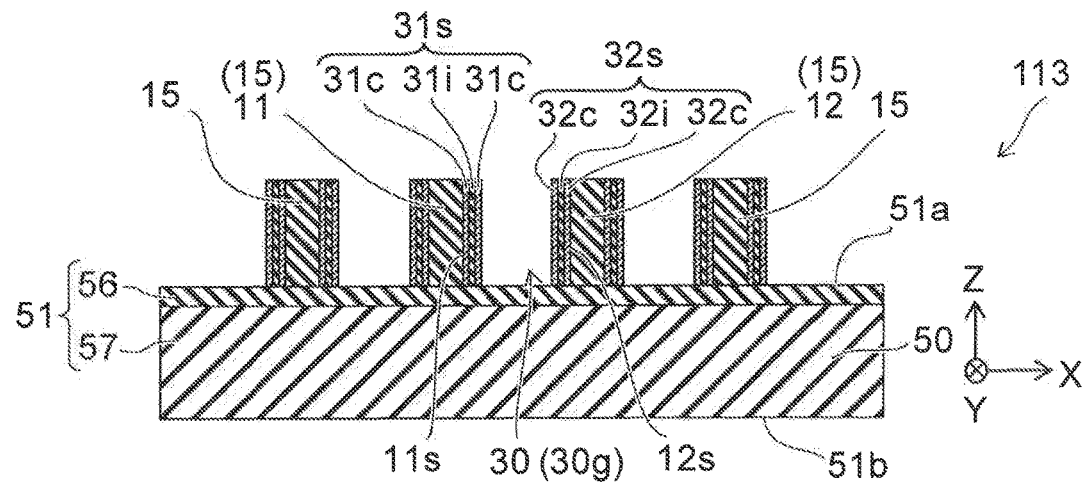
FIG. 6A and FIG. 6B are schematic cross-sectional views illustrating other pattern transfer molds according to the first embodiment.
Figure 6B:
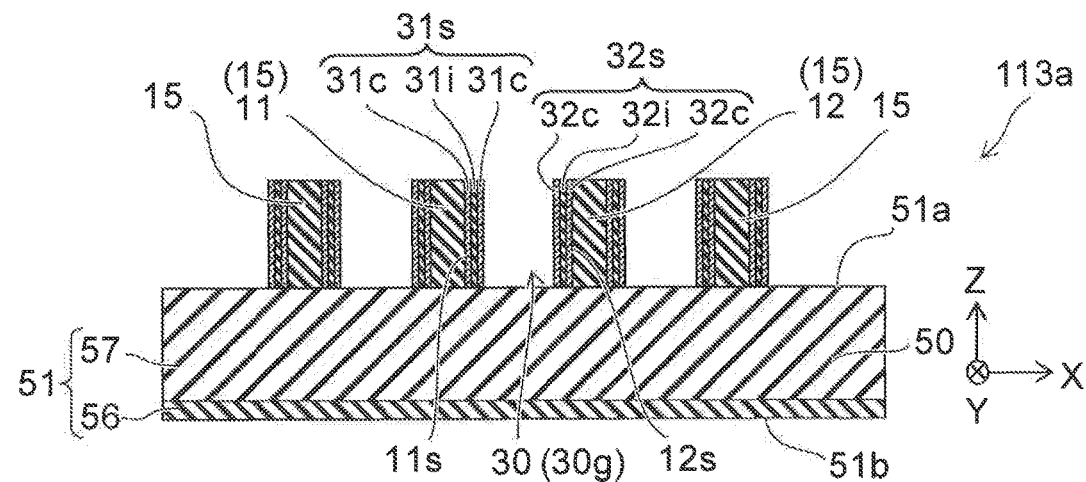

FIG. 6A and FIG. 6B are schematic cross-sectional views illustrating other pattern transfer molds according to the first embodiment.

In the pattern transfer molds 113 and 113a according to the embodiment as shown in FIG. 6A and FIG. 6B, the base unit 51 includes a substrate unit 57 and an elastic layer 56. In the pattern transfer mold 113 as shown in FIG. 6A, the elastic layer 56 is provided between the substrate unit 57 and the first protrusion 11 and between the substrate unit 57 and the second protrusion 12. In the pattern transfer mold 113a as shown in FIG. 6B, the substrate unit 57 is provided between the elastic layer 56 and the first protrusion 11 and between the elastic layer 56 and the second protrusion 12. The elasticity of the elastic layer 56 is higher than the elasticity of the substrate unit 57.

The substrate unit 57 includes, for example, silicon, quartz, etc.

The elastic layer 56 includes, for example, a resin such as polydimethylsiloxane (PDMS), paraxylene, etc.

By providing the elastic layer 56, the positions (e.g., the positions in the Z-axis direction) of the multiple protrusions 15 change easily. Thereby, the contact state or distance between the patterning body 60 and the conductive layers is uniform. For example, the responsiveness of the conductive layers to the configuration of the front surface of the patterning body 60 is high. Thereby, a finer pattern is transferable.

FIG. 7A to FIG. 7D are schematic cross-sectional views illustrating other pattern transfer molds according to the first embodiment.

Figure 7A:
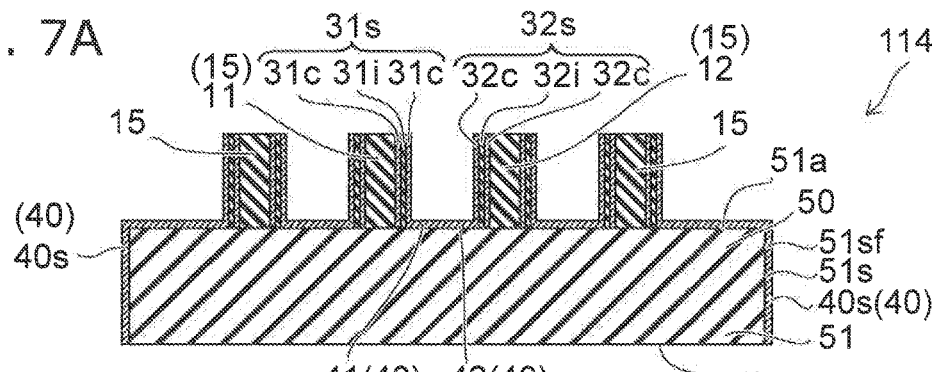
FIG. 7A to FIG. 7D are schematic cross-sectional views illustrating other pattern transfer molds according to the first embodiment.

In the pattern transfer mold 114 according to the embodiment as shown in FIG. 7A, the base unit 51 includes the side surface unit 51s. The side surface unit 51s has a surface 51sf intersecting the first surface 51a. The electrodes 40 (including the first electrode 41 and the second electrode 42) include a portion 40s extending onto the side surface unit 51s. In other words, at least one selected from the first electrode 41 and the second electrode 42 extends onto the side surface unit 51s.

Figure 7B:
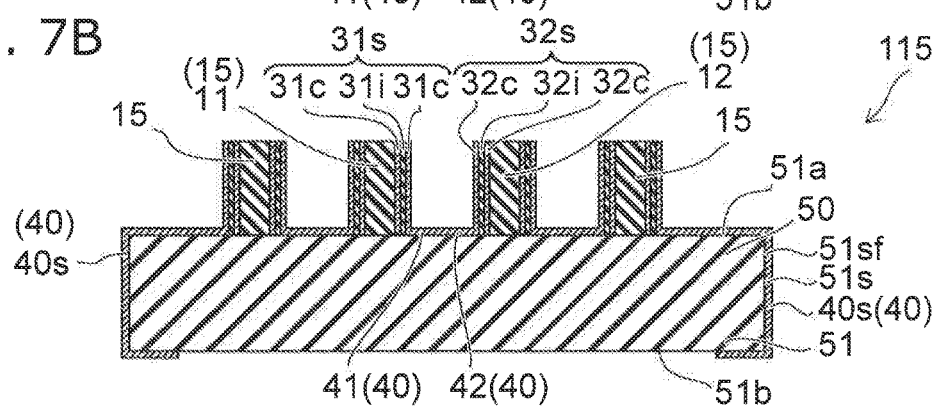

As shown in FIG. 7B, the base unit 51 has the second surface 51b on the side opposite to the first surface 51a. In the pattern transfer mold 115 according to the embodiment, the electrodes 40 (including the first electrode 41 and the second electrode 42) are provided on at least a portion of the second surface 51b.

Figure 7C:
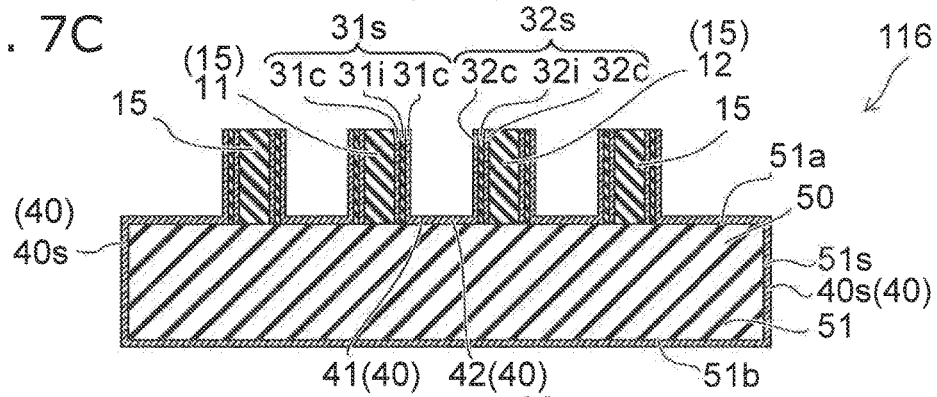

In the pattern transfer mold 116 according to the embodiment as shown in FIG. 7C, the electrodes 40 (including the first electrode 41 and the second electrode 42) are provided on the entire surface of the second surface 51b.

In other words, at least a portion of at least one selected from the first electrode 41 and the second electrode 42 is provided on at least a portion of the second surface 51b.

Figure 7D:
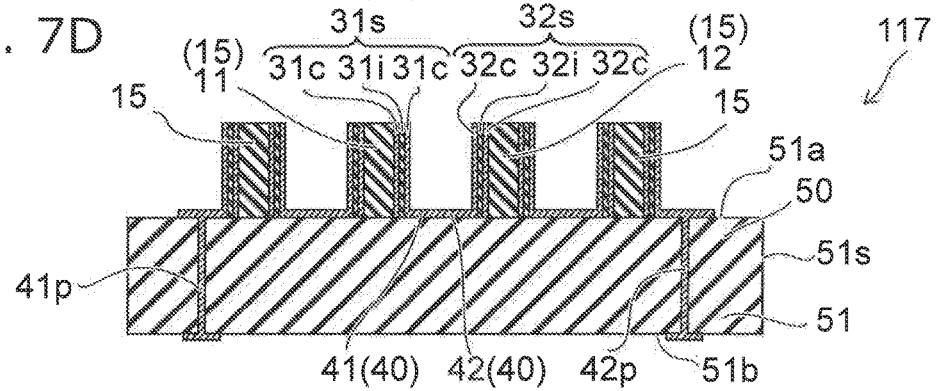

In the pattern transfer mold 117 according to the embodiment as shown in FIG. 7D, the electrodes 40 (including the first electrode 41 and the second electrode 42) include portions (through-portions 41p and 42p, etc.) piercing the base body 50 in the Z-axis direction. In other words, at least one selected from the first electrode 41 and the second electrode 42 includes the through-portions 41p and 42p, etc., piercing the base body 50 in a direction (the Z-axis direction) perpendicular to the first surface 51a. Thereby, the supply of the voltage (the current) to the multiple first conductive layers 31c and the multiple second conductive layers 32c is easy.

In the embodiment, the first electrode 41 and the second electrode 42 function to supply at least one selected from a voltage and a current to the stacked bodies. Various modifications of the configurations of these electrodes are possible.

In the pattern transfer mold 110 according to the embodiment, sidewall nanoelectrodes (the conductive units) are formed on the side walls of an insulative pattern (e.g., the protrusions 15) on an insulative mold (e.g., the base unit 51). At least one selected from a voltage and a current is supplied between the transfer substrate (the patterning body 60) and the sidewall nanoelectrodes. Thereby, a pattern corresponding to the configurations of the sidewall nanoelectrodes can be, for example, electrically transferred onto the transfer substrate. In other words, in the embodiment, transfer sidewall nanoelectrode lithography is implemented. The mold includes a foundation unit (e.g., the base unit 51) of an insulative mold, an insulative pattern unit (e.g., the protrusions, i.e., support units), and the sidewall electrode units. The sidewall nanoelectrode units are disposed on the side walls of the support units. In the embodiment, the sidewall nanoelectrodes include multiple conductive layers. The sidewall nanoelectrodes (the conductive units) include the multiple conductive layers, and an insulating layer provided between the multiple conductive layers.

In the embodiment, the mold includes a voltage/current supply unit (e.g., the first electrode 41, the second electrode 42, etc.). The voltage/current supply unit may be provided on at least one selected from the back surface (the second surface 51b) of the foundation unit and the side surface (the side surface unit 51s) of the foundation unit. The sidewall nanoelectrode units (the conductive units) are electrically connected to the voltage/current supply unit. In the embodiment, the elastic layer 56 may be provided in the foundation unit.

FIG. 8A to FIG. 8D are schematic perspective views illustrating other pattern transfer molds according to the first embodiment.

Figure 8A:
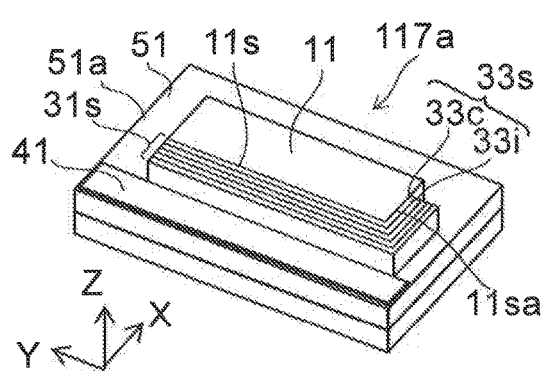
FIG. 8A to FIG. 8D are schematic perspective views illustrating other pattern transfer molds according to the first embodiment.
Figure 8C:
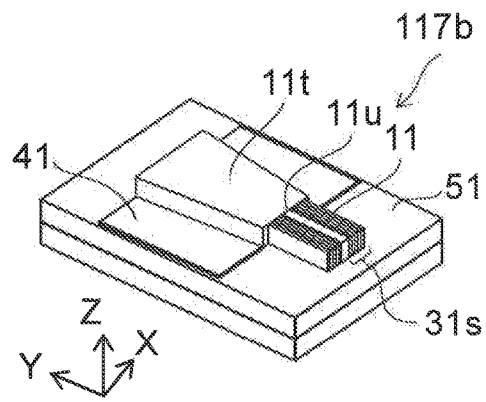
Figure 8B:
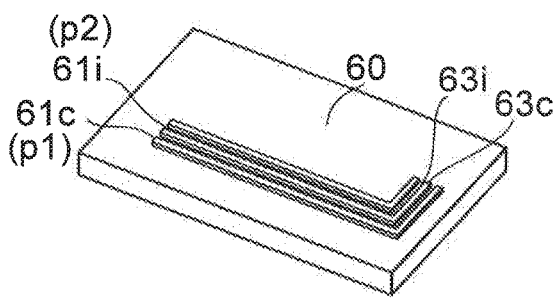
Figure 8D:
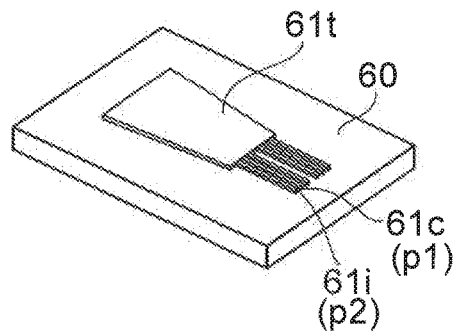

FIG. 8A illustrates the pattern transfer mold 117a. FIG. 8B illustrates the pattern of the patterning body 60 transferred by the pattern transfer mold 117a. FIG. 8C illustrates the pattern transfer mold 117b. FIG. 8D illustrates the pattern of the patterning body 60 transferred by the pattern transfer mold 117b. These drawings show the first protrusion 11 portion. The second protrusion 12 also may have a configuration similar to that of the first protrusion 11 described below.

In the pattern transfer mold 117a as shown in FIG. 8A, a third stacked body 33s is further provided on the first protrusion 11. The first protrusion 11 further includes a first intersecting side surface 11sa. The first intersecting side surface 11sa intersects the first surface 51a and intersects the first side surface 11s. In the example, the first intersecting side surface 11sa extends in the Y-axis direction.

The third stacked body 33s is provided on the first intersecting side surface 11sa. The third stacked body 33s includes multiple third conductive layers 33c and a third insulating layer 33i. The multiple third conductive layers 33c are arranged in a direction (in the example, the X-axis direction) perpendicular to the first intersecting side surface 11sa. The third insulating layer 33i is provided between the multiple third conductive layers 33c.

In the example, the first electrode 41 is electrically connected to at least one of the multiple third conductive layers 33c. At least one selected from the first electrode 41 and the second electrode 42 may be electrically connected to the at least one of the multiple third conductive layers 33c.

In the example, the first stacked body 31s and the third stacked body 33s are formed in L-shaped configurations.

As shown in FIG. 8B, the pattern is transferred onto the patterning body 60 by using a pattern transfer mold such as the pattern transfer mold 117a recited above. The pattern that is transferred onto the patterning body 60 includes the pattern (in the example, the L-shaped configuration) of the first stacked body 31s and the third stacked body 33s.

The portion of the patterning body 60 where the pattern of the first stacked body 31s is transferred includes, for example, a portion extending in the Y-axis direction. The portion where the pattern of the third stacked body 33s is transferred includes, for example, a portion extending in the X-axis direction. For example, a portion 63c that opposes at least one of the multiple third conductive layers 33c and a portion 63i that opposes the third insulating layer 33i are provided in the patterning body 60.

Thus, in the embodiment, a pattern that extends in multiple directions can be transferred.

In the pattern transfer mold 117b as shown in FIG. 8C, the length (the width) in the first direction (the X-axis direction) of a portion of the first protrusion 11 changes. Further, a first apical-portion conductive layer 11t is provided on a portion of an apical portion 11u of the first protrusion 11. In the example, the first apical-portion conductive layer 11t is electrically connected to the first electrode 41.

As shown in FIG. 8D, the pattern is transferred onto the patterning body 60 by using such a pattern transfer mold 117b. The pattern that is transferred onto the patterning body 60 reflects the configuration of the first stacked body 31s and further reflects the configuration of the first apical-portion conductive layer 11t. In other words, a portion 61t that reflects the configuration of the first apical-portion conductive layer 11t is formed in the patterning body 60.

Figure 9:
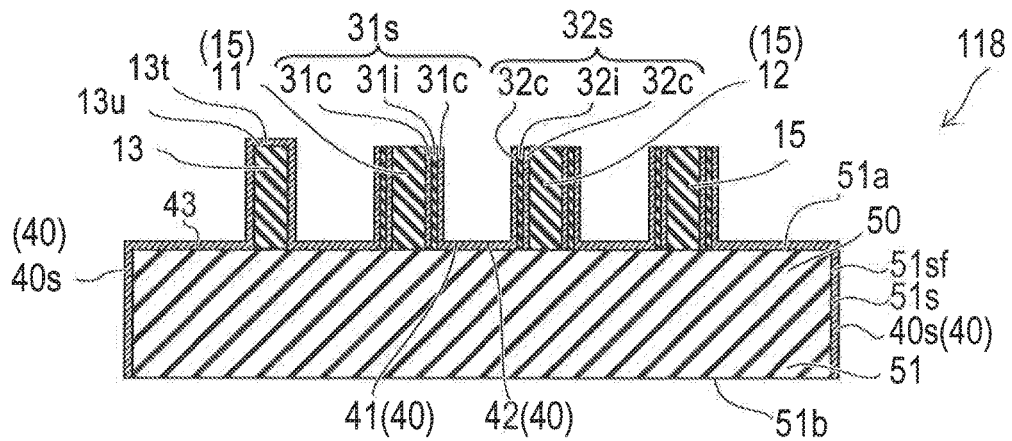
FIG. 9 is a schematic cross-sectional view illustrating another pattern transfer mold according to the first embodiment.

FIG. 9 is a schematic cross-sectional view illustrating another pattern transfer mold according to the first embodiment.

In the pattern transfer mold 118 according to the embodiment as shown in FIG. 9, the base body 50 further includes a third protrusion 13. The third protrusion 13 is provided on the first surface 51a. The third protrusion 13 includes a third apical portion 13u. The third apical portion 13u is the end of the third protrusion 13 in the Z-axis direction and is separated from the first surface 51a.

The pattern transfer mold 118 further includes a third apical-portion conductive layer 13t provided on the third apical portion 13u. The third apical-portion conductive layer 13t is electrically connected to a third electrode 43. In the example, the third electrode 43 is electrically connected to the first electrode 41 and the second electrode 42. As described below, the third electrode 43 may be electrically insulated from at least one selected from the first electrode 41 and the second electrode 42.

The length (the width) along the X-axis direction (the first direction) of the third protrusion 13 is longer than the lengths (the thicknesses) along the X-axis direction of the first conductive layers 31c and longer than the lengths (the thicknesses) along the X-axis direction of the second conductive layers 32c. The length (the width) along the X-axis direction of the third apical-portion conductive layer 13t is longer than the lengths (the thicknesses) along the X-axis direction of the first conductive layers 31c and longer than the lengths (the thicknesses) along the X-axis direction of the second conductive layers 32c.

By using such a pattern transfer mold 118, a fine pattern that reflects the multiple first conductive layers 31c, a fine pattern that reflects the multiple second conductive layers 32c, and a large pattern that reflects the third apical-portion conductive layer 13t can be formed in the patterning body 60. The formation can be performed, for example, simultaneously.

Thus, in the example, a pattern corresponding to the configuration of the sidewall nanoelectrode (the multiple conductive layers) of the support unit (the protrusions 15) and the configuration of the electrode (the apical-portion conductive layer) of the front surface of the support unit can be transferred. For example, the thickness of the sidewall nanoelectrode is nanoscale. For example, the size of the electrode of the front surface of the support unit is microscale. In the embodiment, a multiscale pattern that includes nanoscale and microscale is transferred collectively.

In the case where the first electrode 41, the second electrode 42, and the third electrode 43 are electrically insulated from each other, a pattern that reflects the fine pattern reflecting the multiple first conductive layers 31c, the fine pattern reflecting the multiple second conductive layers 32c, and the large pattern reflecting the third apical-portion conductive layer 13t can be formed independently.

Figure 10A:
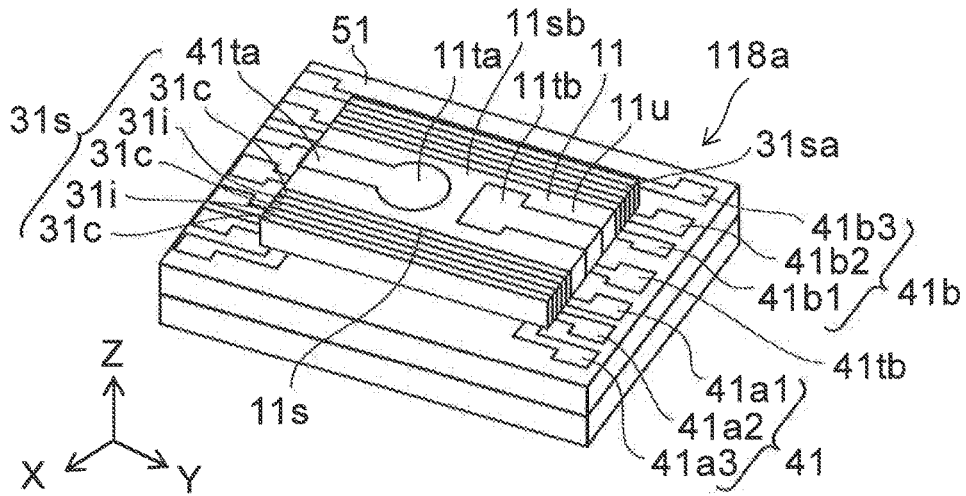
FIG. 10A to FIG. 10C are schematic perspective views illustrating another pattern transfer mold according to the first embodiment.
Figures 10B, 10C:
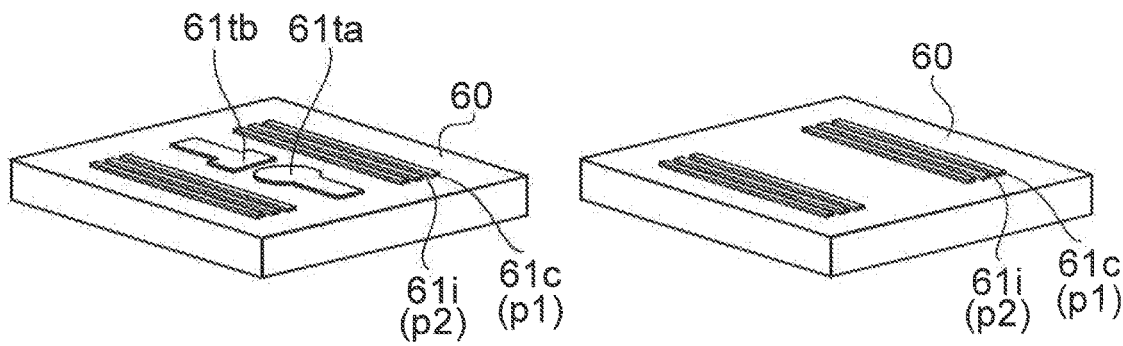

FIG. 10A to FIG. 10C are schematic perspective views illustrating another pattern transfer mold according to the first embodiment.

FIG. 10A illustrates the pattern transfer mold 118a. FIG. 10B shows one example of the pattern of the patterning body 60 transferred by the pattern transfer mold 118a. FIG. 10C shows another example of the pattern of the patterning body 60 transferred by the pattern transfer mold 118a. These drawings show the first protrusion 11 portion. The second protrusion 12 also has a configuration similar to that of the first protrusion 11 described below.

In the pattern transfer mold 118a as shown in FIG. 10A, two apical-portion conductive layers (an apical-portion conductive layer 11ta and an apical-portion conductive layer 11tb) are provided on a portion of the apical portion 11u of the first protrusion 11. In the example, the pattern of the apical-portion conductive layer 11ta is different from the pattern of the apical-portion conductive layer 11tb. In the embodiment, these patterns may be the same. The number of an apical-portion conductive layers 11ta may be two or more.

Further, a stacked body 31sa is provided on a side surface 11sb of the first protrusion 11 on the side opposite to the first side surface 11s. The stacked body 31sa includes multiple conductive layers, and an insulating layer provided between the multiple conductive layers. For example, the stacked body 31sa has a configuration similar to that of the first stacked body 31s.

In the example, the first electrode 41 that is electrically connected to each of the multiple first conductive layers 31c includes multiple electrodes (electrodes 41a1, 41a2, and 41a3, etc.). The electrodes 41a1, 41a2, and 41a3 are electrically connected independently to the multiple first conductive layers 31c, respectively.

On the other hand, an electrode 41b is connected to each of the multiple conductive layers of the stacked body 31sa. In the example, the electrode 41b includes multiple electrodes (electrodes 41b1, 41b2, and 41b3, etc.). The electrodes 41b1, 41b2, and 41b3 are electrically connected independently to the multiple conductive layers of the stacked body 31sa, respectively.

Further, an electrode 41ta that is electrically connected to the apical-portion conductive layer 11ta is provided; and an electrode 41tb that is electrically connected to the apical-portion conductive layer 11tb is provided.

In such a pattern transfer mold 118a, the transfer of different patterns is possible by modifying at least one selected from the application (the supply) of the voltage and the supply of the current to the multiple electrodes recited above.

In one example of the transfer as shown in FIG. 10B, the voltage is applied to all of the electrodes recited above. In other words, a current is supplied. Thereby, a pattern that corresponds to the patterns of the conductive layers recited above is transferred onto the patterning body 60. For example, a pattern that reflects the pattern of the multiple first conductive layers 31c is formed in the patterning body 60. In other words, the first portion 61c (the first patterning unit p1) and the third portion 61i (the second patterning unit p2) are formed. Also, a pattern that reflects the pattern of the multiple stacked bodies of the stacked body 31sa is formed. Further, a pattern that reflects the pattern of the apical-portion conductive layer is formed in the patterning body 60. In other words, a portion 61ta that opposes the apical-portion conductive layer 11ta is formed; and a portion 61tb that opposes the apical-portion conductive layer 11tb is formed. The portion 61ta and the portion 61tb are portions supplied with the voltage and the current and are included in, for example, the first patterning unit p1.

In another example of the transfer as shown in FIG. 10C, a voltage is applied to the electrodes 41a1, 41a2, 41a3, 41b1, 41b2, and 41b3; and a voltage is not applied to the electrode 41ta and the electrode 41tb. Thereby, the pattern that reflects the pattern of the multiple first conductive layers 31c is formed in the patterning body 60. Also, the pattern that reflects the pattern of the multiple stacked bodies of the stacked body 31sa is formed. However, the pattern that reflects the pattern of the apical-portion conductive layer is not formed.

The electrodes 41a1, 41a2, 41a3, 41b1, 41b2, 41b3, and 41ta and the electrode 41tb may be provided on the front surface of the base body 50. These electrodes may be disposed on the side wall of the base body 50 or the back surface of the base body 50.

Thus, in the embodiment, by controlling the current/voltage supply unit On/Off, the configuration of the transferred pattern can be modified.

Second Embodiment

The embodiment is a pattern formation method that uses one selected from the pattern transfer molds according to the first embodiment or a pattern transfer mold of a modification of one selected from the pattern transfer molds according to the first embodiment.

Figure 11:
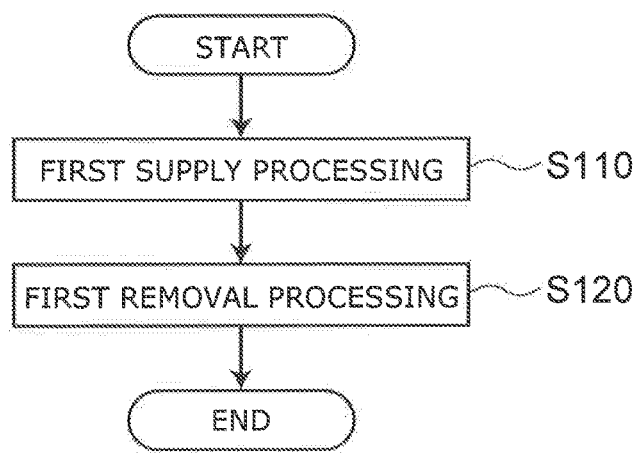
FIG. 11 is a flowchart illustrating the pattern formation method according to the second embodiment.

FIG. 11 is a flowchart illustrating the pattern formation method according to the second embodiment.

In the pattern formation method according to the embodiment as shown in FIG. 11, the first supply processing (step S110) including causing the first stacked body 31s and the second stacked body 32s of the pattern transfer mold to oppose the front surface of the patterning body 60 and supplying a voltage between the patterning body 60 and at least one of the multiple first conductive layers 31c and between the patterning body 60 and at least one of the multiple second conductive layers 32c is implemented.

The processing includes implementing the processing described in regard to FIG. 3A and FIG. 3B.

For example, the patterning body 60 may include at least one selected from a metal and a semiconductor (including silicon). At this time, the first supply processing includes oxidizing at least a portion of the at least one selected from the metal and the semiconductor recited above included in the first patterning unit p1 (and the second patterning unit p2).

For example, the first supply processing recited above includes causing the chemical properties of the first patterning unit p1 including the first portion 61c of the patterning body 60 opposing the at least one of the multiple first conductive layers 31c recited above and the second portion 62c of the patterning body 60 opposing the at least one of the multiple second conductive layers 32c recited above to be different from the chemical properties of the other portions. For example, the chemical properties of the first patterning unit p1 are caused to be different from the chemical properties of the second patterning unit p2 including the third portion 61i of the patterning body 60 opposing the first insulating layer 31i and the fourth portion 62i of the patterning body 60 opposing the second insulating layer 32i.

In the case where the patterning body 60 includes silicon, the first supply processing includes oxidizing the silicon included in the first patterning unit p1. Thereby, the first patterning unit p1 becomes silicon oxide; and the second patterning unit p2 remains as silicon.

In the pattern formation method as shown in FIG. 11, the first removal processing (step S120) of removing at least a portion of one selected from the first patterning unit p1 and the second patterning unit p2 is implemented.

In other words, the processing described in regard to FIG. 3A and FIG. 3B is implemented.

In the first removal processing, the first patterning unit p1 may be removed and the second patterning unit p2 may be caused to remain. In the first removal processing, the second patterning unit p2 may be removed and the first patterning unit p1 may be caused to remain.

Further, in the embodiment, the second supply processing described below may be implemented prior to the first removal processing recited above.

In such a case, for example, in the first supply processing, the voltage is supplied between the patterning body 60 and one portion of the multiple first conductive layers 31c and between the patterning body and one portion of the multiple second conductive layers 32c.

On the other hand, in the second supply processing, the voltage is supplied between the patterning body 60 and one other portion of the multiple first conductive layers 31c and between the patterning body 60 and one other portion of the multiple second conductive layers 32c.

Thus, the supply of the voltage to different conductive layers is performed. For example, the processing can be implemented by the control of the supply of the voltage to the electrodes 41a1, 41a2, 41a3, 41b1, 41b2, and 41b3 illustrated in FIG. 10A, etc.

In the first removal processing, the first patterning unit p1 includes a portion of the patterning body 60 opposing the one portion of the multiple first conductive layers 31c recited above, a portion of the patterning body 60 opposing the one other portion of the multiple first conductive layers 31c recited above, a portion of the patterning body 60 opposing the one portion of the multiple second conductive layers 32c recited above, and a portion of the patterning body 60 opposing the one other portion of the multiple second conductive layers 32c recited above.

The first removal processing of such a first patterning unit p1 and such a second patterning unit p2 is performed. The pattern can be transferred selectively for the multiple conductive layers.

According to the embodiment, a pattern transfer mold and a pattern formation method that can transfer a fine pattern can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components included in the pattern transfer mold such as the base body, the base unit, the protrusion, the substrate unit, the elastic layer, the stacked body, the conductive layer, the electrode, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all pattern transfer molds and pattern formation methods practicable by an appropriate design modification by one skilled in the art based on the pattern transfer molds and pattern formation methods described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A pattern transfer mold, comprising:
  a base body including
    a base unit including a first surface,
    a first protrusion provided on the first surface, the first protrusion having a first side surface intersecting the first surface, and
    a second protrusion provided on the first surface and separated from the first protrusion in a first direction parallel to the first surface, the second protrusion having a second side surface intersecting the first surface and opposing the first side surface in the first direction;
  a first stacked body provided on the first side surface between the first protrusion and the second protrusion, the first stacked body including a plurality of first conductive layers and a first insulating layer, the first conductive layers being arranged in the first direction, the first insulating layer being provided between the first conductive layers;
  a second stacked body provided on the second side surface between the first protrusion and the second protrusion and separated from the first stacked body, the second stacked body including a plurality of second conductive layers and a second insulating layer, the second conductive layers being arranged in the first direction, the second insulating layer being provided between the second conductive layers, the second stacked body being capable of containing, between the first stacked body and the second stacked body, a gas or a material having a hardness lower than hardnesses of the first protrusion, the second protrusion, the first stacked body, and the second stacked body;
  a first electrode electrically connected to at least one of the first conductive layers; and
  a second electrode electrically connected to at least one of the second conductive layers;
wherein a pitch of the plurality of first conductive layers is less than the length in the first direction of the first protrusion, and a pitch of the plurality of second conductive layers is less than the length in the first direction of the second protrusion.

2. The mold according to claim 1, wherein the gas is contained between the first stacked body and the second stacked body.

3. The mold according to claim 1, further comprising a filled unit of the material provided in at least a portion of a region between the first stacked body and the second stacked body.

4. The mold according to claim 1, further comprising a resin layer provided in at least a portion of a region between the first stacked body and the second stacked body.

5. The mold according to claim 1, wherein
the base unit further includes a side surface unit having a surface intersecting the first surface, and
at least one selected from the first electrode and the second electrode extends onto the side surface unit.

6. The mold according to claim 1, wherein
the base unit has a second surface on a side opposite to the first surface, and
at least a portion of at least one selected from the first electrode and the second electrode is provided on at least a portion of the second surface.

7. The mold according to claim 1, wherein at least one selected from the first electrode and the second electrode includes a through-portion piercing the base body in a direction perpendicular to the first surface.

8. The mold according to claim 1, further comprising a third stacked body,
the first protrusion further including a first intersecting side surface intersecting the first surface and intersecting the first side surface,
the third stacked body being provided on the first intersecting side surface,
the third stacked body including a plurality of third conductive layers and a third insulating layer, the third conductive layers being arranged in a direction perpendicular to the first intersecting side surface, the third insulating layer being provided between the third conductive layers,
at least one selected from the first electrode and the second electrode being electrically connected to at least one of the third conductive layers.

9. The mold according to claim 1, further comprising:
an apical-portion conductive layer; and
a third electrode electrically connected to the apical-portion conductive layer,
the base body further including a third protrusion provided on the first surface,
the apical-portion conductive layer being provided on the third protrusion.

10. The mold according to claim 9, wherein a length in the first direction of the apical-portion conductive layer is longer than lengths in the first direction of each of the first conductive layers.

11. The mold according to claim 1, wherein
the hardness of the first stacked body is higher than the hardness of the first protrusion and the hardness of the second protrusion, and
the hardness of the second stacked body is higher than the hardness of the first protrusion and the hardness of the second protrusion.

12. The mold according to claim 1, wherein
lengths in the first direction of each of the first conductive layers are not more than a length in the first direction of the first protrusion, and
a length in the first direction of the first insulating layer is not more than the length in the first direction of the first protrusion.

13. The mold according to claim 1, wherein
thicknesses of each of the first conductive layers are not less than 1 nanometer and not more than 100 nanometers, and
a thickness of the first insulating layer is not less than 1 nanometer and not more than 100 nanometers.

14. A pattern formation method, comprising:
first supply processing including causing first and second stacked bodies of a pattern transfer mold to oppose a front surface of a patterning body and supplying a voltage between the patterning body and at least one of a plurality of first conductive layers and between the patterning body and at least one of a plurality of second conductive layers; and
first removal processing including removing at least a portion of one selected from a first patterning unit of the patterning body and a second patterning unit of the patterning body, the first patterning unit including a first portion of the patterning body and a second portion of the patterning body, the first portion opposing the at least one of the first conductive layers, the second portion opposing the at least one of the second conductive layers, the second patterning unit including a third portion of the patterning body and a fourth portion of the patterning body, the third portion opposing the first insulating layer, the fourth portion opposing the second insulating layer,
the pattern transfer mold including:
a base body including
a base unit having a first surface,
a first protrusion provided on the first surface, the first protrusion having a first side surface intersecting the first surface, and
a second protrusion provided on the first surface and separated from the first protrusion in a first direction parallel to the first surface, the second protrusion having a second side surface intersecting the first surface and opposing the first side surface in the first direction;
a first stacked body provided on the first side surface between the first protrusion and the second protrusion, the first stacked body including a plurality of first conductive layers and a first insulating layer, the first conductive layers being arranged in the first direction, the first insulating layer being provided between the first conductive layers;
a second stacked body provided on the second side surface between the first protrusion and the second protrusion and separated from the first stacked body, the second stacked body including a plurality of second conductive layers and a second insulating layer, the second conductive layers being arranged in the first direction, the second insulating layer being provided between the second conductive layers, the second stacked body being capable of containing, between the first stacked body and the second stacked body, a gas or a material having a hardness lower than hardnesses of the first protrusion, the second protrusion, the first stacked body, and the second stacked body;
a first electrode electrically connected to at least one of the first conductive layers; and
a second electrode electrically connected to at least one of the second conductive layers;
wherein a pitch of the plurality of first conductive layers is less than the length in the first direction of the first protrusion, and a pitch of the plurality of second conductive layers is less than the length in the first direction of the second protrusion.

15. The method according to claim 14, wherein the first supply processing includes causing a chemical property of the first patterning unit to be different from a chemical property of the second patterning unit.

16. The method according to claim 14, wherein
the patterning body includes at least one selected from a metal and a semiconductor, and
the first supply processing includes oxidizing at least a portion of the at least one selected from the metal and the semiconductor included in the first patterning unit.

17. The method according to claim 14, wherein the first removal processing includes removing the first patterning unit and causing the second patterning unit to remain.

18. The method according to claim 14, wherein the first removal processing includes removing the second patterning unit and causing the first patterning unit to remain.

19. The method according to claim 14, further comprising second supply processing performed prior to the first removal processing,
the first supply processing including supplying the voltage between the patterning body and one portion of the plurality of first conductive layers and between the patterning body and one portion of the plurality of second conductive layers,
the second supply processing including supplying the voltage between the patterning body and one other portion of the plurality of first conductive layers and between the patterning body and one other portion of the plurality of second conductive layers,
the first patterning unit in the first removal processing including a portion of the patterning body opposing the one portion of the plurality of first conductive layers, a portion of the patterning body opposing the one other portion of the plurality of first conductive layers, a portion of the patterning body opposing the one portion of the plurality of second conductive layers, and a portion of the patterning body opposing the one other portion of the plurality of second conductive layers.

20. The method according to claim 14, wherein
the patterning body includes silicon, and
the first supply processing includes oxidizing the silicon included in the first patterning unit.

* * * * *